United States Patent
Takayama et al.

[11] Patent Number: 6,016,170
[45] Date of Patent: Jan. 18, 2000

[54] DOUBLE CONVERSION TELEVISION TUNER

[75] Inventors: Akira Takayama; Michihiro Komatsu, both of Fukushima-ken, Japan

[73] Assignee: Alps Electric Co., Ltd., Tokyo, Japan

[21] Appl. No.: 08/717,865

[22] Filed: Sep. 23, 1996

[30] Foreign Application Priority Data

Sep. 25, 1995 [JP] Japan .................................. 7-246323

[51] Int. Cl.⁷ ........................................................ H04N 5/50
[52] U.S. Cl. ................... 348/731; 348/735; 455/189.1; 455/190.1; 455/192.1; 455/209
[58] Field of Search .................................. 348/731, 732, 348/725, 726; 455/313–316, 266, 207–209, 189.1, 190.1, 191.1, 192.1, 195.1; H04N 5/50

[56] References Cited

U.S. PATENT DOCUMENTS

| | | | |
|---|---|---|---|
| 4,395,777 | 7/1983 | Oki et al. | 455/183 |
| 4,581,643 | 4/1986 | Carlson | 348/731 |
| 5,311,318 | 5/1994 | Dobrovolny | 348/731 |
| 5,418,815 | 5/1995 | Ishikawa et al. | 375/216 |
| 5,598,221 | 1/1997 | Miyahara et al. | 348/554 |
| 5,640,213 | 6/1997 | Miyahara et al. | 348/726 |

FOREIGN PATENT DOCUMENTS 55-129674  9/1980  Japan ................................ H01H 3/70

*Primary Examiner*—Glenton B. Burgess
*Attorney, Agent, or Firm*—Brinks Hofer Gilson & Lione

[57] ABSTRACT

A double conversion television tuner capable of receiving analog and digital telecasts and having a reduced number of frequency conversion stages with fewer oscillators to minimize beat disturbances between local oscillation signals, the tuner being made up of fewer circuit components costing less than conventional tuners to manufacture. The inventive tuner comprises a first frequency conversion stage for converting in frequency a channel-select received signal to a first intermediate frequency signal to be output, a second frequency conversion stage for converting in frequency the first intermediate frequency signal to a second intermediate frequency signal to be output, and an analog and a digital demodulator for demodulating the second intermediate frequency signal. The local oscillation signal of the second frequency conversion stage is switched to a first frequency if the base-band signal of the channel-select received signal is an analog signal, and to a second frequency if the base-band signal is a digital signal, the second frequency being higher than the first frequency.

6 Claims, 4 Drawing Sheets

DOUBLE CONVERSION TELEVISION TUNER

BACKGROUND OF THE INVENTION

The present invention relates to a double conversion television tuner and, more particularly, to a double conversion television tuner which eliminates the need for the frequency converter of a digital signal processing block during selective reception of a television broadcast with its base-band signal in either analog or digital format, whereby both the deterioration in the S/N ratio and the generation of signal distortion attributable to beat disturbances are minimized.

Along with significant advances in multimedia-related technologies in recent years has come an accelerated transition from analog broadcast which uses an analog signal as its base-band signal to digital broadcast which utilizes a digital base-band signal in a variety of telecast operations including terrestrial television, cable television (CATV) and satellite broadcasting television (BSTV).

In such telecast operations, digital broadcast differs from analog broadcast not only in the base-band signal format but also in modulation method. For example, digital broadcast typically employs QPSK (quadrature phase shift keying) or QAM (quadrature amplitude modulation). With this modulation scheme, the television tuner in digital television sets comprises an analog and a digital signal demodulation circuit for demodulating the received signals. As such, the television tuner is called a double conversion television tuner.

FIG. 4 is a block diagram of a conventional double conversion television tuner. As shown in FIG. 4, a conventional double conversion television tuner 41 comprises an antenna input terminal 42, a broad-band pass filter 43, a first frequency conversion stage 44, a second frequency conversion stage 45, a signal divider 46, an analog signal modulator 47, a third frequency conversion stage 48, a digital signal demodulator 49, an analog signal output terminal 50, a digital signal output terminal 51 and a channel selector (channel-select buttons) 52.

The first frequency conversion stage 44 includes a first frequency mixer 53, a first oscillator 54, a phase-locked loop (PLL) 55 and a first intermediate frequency signal selection band-pass filter 56. The second frequency conversion stage 45 has a second frequency mixer 57, a second oscillator 58 and a second intermediate frequency signal selection low-pass filter 59. The third frequency conversion stage 48 comprises a third frequency mixer 60, a third oscillator 61 and a digital signal selection low-pass filter 62.

In the first frequency conversion stage 44, the first frequency mixer 53 has its first input terminal connected to the antenna input terminal 42 via the broad-band pass filter 43, its second input terminal connected to the output terminal of the first oscillator 54, and its output terminal connected via the band-pass filter 56 to the first input terminal of the second frequency mixer 57 in the second frequency conversion stage 45 located downstream. The phase-locked loop 55 has its input terminal connected to the output terminal of the first oscillator 54, its output terminal connected to the control input terminal of the first oscillator 54, and its control input terminal connected to the output terminal of the channel selector 52.

In the second frequency conversion stage 45, the second frequency mixer 57 has its second input terminal connected to the output terminal of the second oscillator 58, and its output terminal connected via the low-pass filter 59 to the input terminal of the signal divider 46 located downstream. The analog signal demodulator 47 has its input terminal connected to the first output terminal of the signal divider 46, and its output terminal connected to the analog signal output terminal 50.

In the third frequency conversion stage 48, the third frequency mixer 60 has its first input terminal connected to the second output terminal of the signal divider 46, its second input terminal connected to the output terminal of the third oscillator 61, and its output terminal connected via the low-pass filter 62 to the digital signal demodulator 49 located downstream. The digital signal demodulator 49 has its input terminal connected to the output terminal of the low-pass filter 62, and its output terminal connected to the digital signal output terminal 51.

The double conversion television tuner 41 of the above-described constitution works substantially as follows: a desired television broadcast is initially selected by operation of the channel selector (channel-select buttons) 52. In response to the selection, the output voltage of the phase-locked loop 55 varies. This in turn alters the frequency of a first local oscillation signal of the first oscillator 54 whose frequency is controlled by the output voltage of the PLL 55. At this point, the signal received via an antenna (not shown) is forwarded to the antenna input terminal 42. The broad-band pass filter 43 is given the received signal and removes unnecessary components therefrom. From the broad-band pass filter 43, the received signal is sent to the first frequency conversion stage 44. The first frequency conversion stage 44 mixes the received signal and the first local oscillation signal in terms of frequency, and supplies the frequency-mixed output to the band-pass filter 56. From the received signal, the band-pass filter 56 extracts only the channel-select received signal selected by the channel selector 52. The signal thus extracted is a first intermediate frequency signal obtained by converting the received signal into a first intermediate frequency $f_{IF1}$. The first intermediate frequency signal is fed to the second frequency conversion stage 45 located downstream.

The second frequency conversion stage 45 mixes in terms of frequency the first intermediate frequency signal and a second local oscillation signal which is generated by the second oscillator 58 and which has a fixed frequency. The frequency-mixed output is sent to the low-pass filter 59. The low-pass filter extracts as a second intermediate frequency signal the channel-select received signal obtained by converting the received signal into a second intermediate frequency $f_{IF2}$. The second intermediate frequency signal is supplied to the signal divider 46 located downstream. The signal divider 46 divides the second intermediate frequency signal into two parts, one part destined to the analog signal demodulator 47 and the other part to the third frequency conversion stage 48.

If the base-band signal of the second intermediate frequency signal thus supplied is an analog signal, the analog signal demodulator 47 demodulates the second intermediate frequency signal to analog format and sends the demodulated output to the analog signal output terminal 50. The third frequency conversion stage 48 mixes in terms of frequency the second intermediate frequency signal and a third local oscillation frequency generated by the third oscillator 61, and sends the frequency-mixed output to the low-pass filter 62. The low-pass filter 62 extracts as a third intermediate frequency signal the channel-select received signal obtained by converting the received signal into a third intermediate frequency $f_{IF3}$. The third intermediate frequency signal is fed to the digital signal demodulator 49 located downstream. At this point, if the base-band signal of the supplied third intermediate frequency signal is a digital signal, the digital signal demodulator 49 demodulates the third intermediate frequency signal to digital format, and sends the demodulated output to the digital signal output terminal 51.

In the above-described double conversion television tuner 41 of the prior art, the first frequency conversion stage 44 converts the frequency of the channel-select received signal to the first intermediate frequency $f_{IF1}$ which is higher than the frequency of the channel-select received signal, and the second frequency conversion stage 45 converts the first intermediate frequency $f_{IF1}$ to the second intermediate frequency $f_{IF2}$ which is lower than the first. Where the base-band signal is a digital signal, the tuner 41 further needs for demodulation purposes a frequency still lower than the second intermediate frequency $f_{IF2}$. This requires the third frequency conversion stage 48 to convert the second intermediate frequency $f_{IF2}$ to the third intermediate frequency $f_{IF3}$ which is lower than the second.

As outlined, the conventional double conversion television tuner 41 needs three frequency conversion stages: the first frequency conversion stage 44, the second frequency conversion stage 45 and the third frequency conversion stage 48. The three-stage structure involves installing the first oscillator 54 for generating the first local oscillation signal, the second oscillator 58 for generating the second local oscillation signal and the third oscillator 61 for generating the third local oscillation signal. The three-oscillator setup is vulnerable to beat disturbances between oscillators and can contribute to deteriorating the reception performance of the double conversion television tuner. Another disadvantage of the conventional constitution is that it needs numerous circuit components and thereby pushes up the production costs of the double conversion television tuner.

SUMMARY OF THE INVENTION

It is therefore an object of the present invention to provide a double conversion television tuner which has a reduced number of frequency conversion stages to diminish beat disturbances and which includes fewer circuit components to minimize the production costs of the tuner.

In carrying out the invention and according to one aspect thereof, there is provided a double conversion television tuner comprising: a first frequency conversion stage for converting in frequency a channel-select received signal to a first intermediate frequency signal to be output; a second frequency conversion stage for converting in frequency the first intermediate frequency signal to a second intermediate frequency signal to be output; and a demodulation stage for demodulating the second intermediate frequency signal; wherein the channel-select received signal has a base-band signal in any one of two signal formats; and wherein the local oscillation signal of the second frequency conversion stage is switched either to a first frequency or to a second frequency in accordance with the format of the base-band signal constituting the channel-select received signal.

In the above constitution of the invention, the frequency of the local oscillation signal used by the second frequency conversion stage is switched to the first frequency if the base-band signal in the channel-select received signal is illustratively an analog signal. In this case, the second frequency conversion stage outputs a second intermediate frequency signal having a frequency $f_{IF2A}$. If the base-band signal is a digital signal, the frequency of the local oscillation signal used by the second frequency conversion stage is switched to the second frequency which is higher than the first frequency. With the base-band signal in digital format, the second frequency conversion stage outputs a second intermediate frequency signal having a frequency $f_{IF2D}$ which is lower than the frequency $f_{IF2A}$. Unlike the conventional double conversion television tuner, the inventive setup above eliminates the need for further lowering the frequency $f_{IF2D}$ of the second intermediate frequency signal using a third frequency conversion stage during demodulation of a digital telecast. That is, the third frequency conversion stage becomes unnecessary.

With the third frequency conversion stage omitted, the invention reduces the number of oscillators for generating local oscillation signals and thereby diminishes possible beat disturbances between such signals. The absence of the third frequency conversion stage also means fewer circuit components and contributes to lowering the production costs of the tuner.

Other objects, features and advantages of the present invention will become apparent in the following specification and accompanying drawings.

DESCRIPTION OF THE PREFERRED EMBODIMENTS

Figure 1:
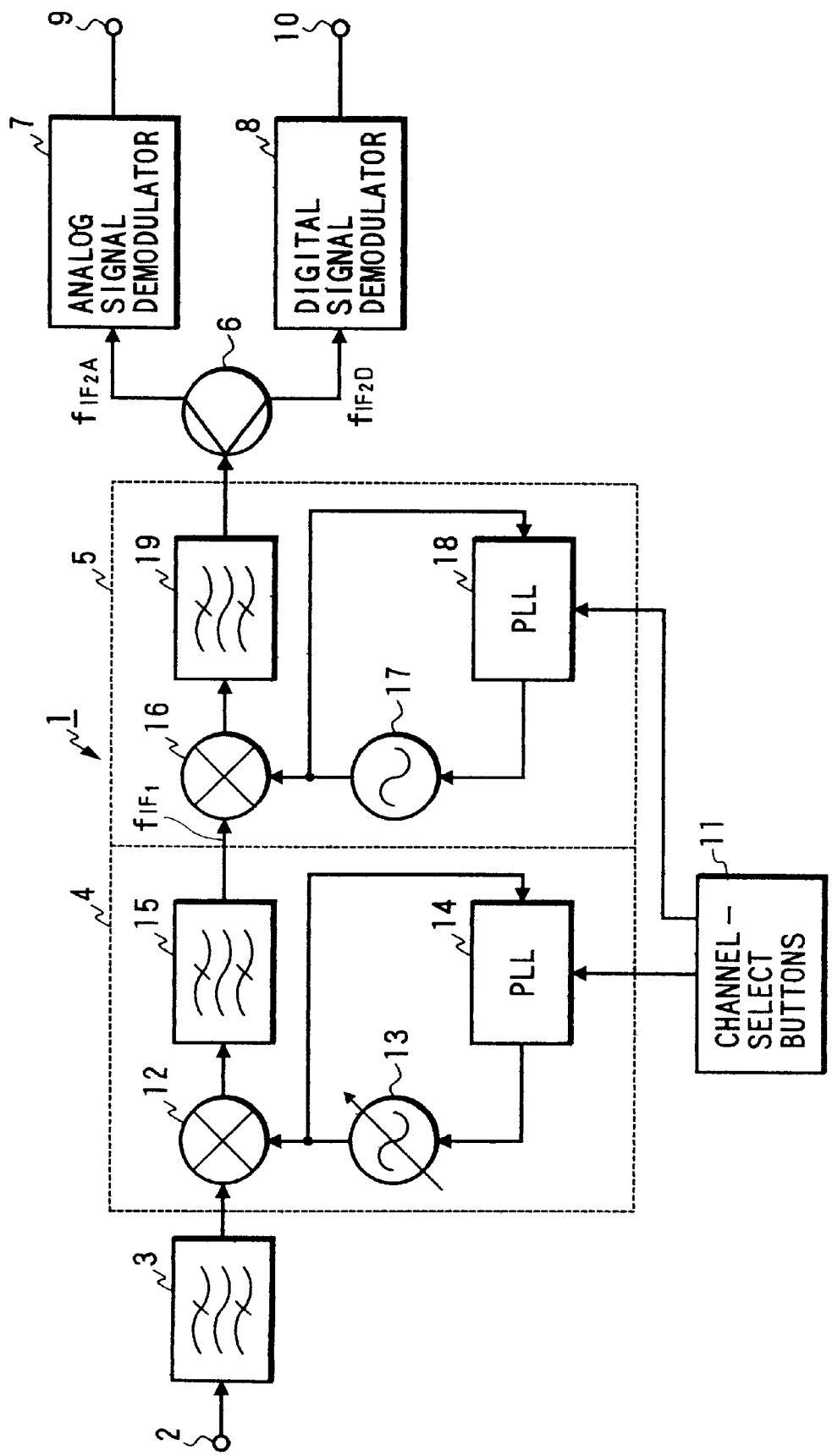
FIG. 1 is a block diagram of a double conversion television tuner practiced as a first embodiment of the invention.

FIG. 1 is a block diagram of a double conversion television tuner practiced as the first embodiment of the invention. As shown in FIG. 1, a double conversion television tuner 1 embodying the invention comprises an antenna input terminal 2, a broad-band pass filter 3, a first frequency conversion stage 4, a second frequency conversion stage 5, a signal divider 6, an analog signal demodulator 7, a digital signal demodulator 8, an analog signal output terminal 9, a digital signal output terminal 10 and a channel selector (channel-select buttons) 11.

The first frequency conversion stage 4 is made up of a first frequency mixer 12, a first oscillator 13, a first phase-locked loop (PLL) 14 and a first intermediate frequency signal selection band-pass filter 15. The second frequency conversion stage 5 includes a second frequency mixer 16, a second oscillator 17, a second phase-locked loop (PLL) 18 and a second intermediate frequency signal selection low-pass filter 19.

In the first frequency conversion stage 4, the first frequency mixer 12 has its first input terminal connected to the antenna input terminal 2 via the broad-band pass filter 3, its second input terminal connected to the output terminal of the first oscillator 13, and its output terminal connected via the band-pass filter 15 to the first input terminal of the second frequency mixer 16 in the second frequency conversion stage 5 located downstream. The first phase-locked loop 14 has its input terminal connected to the output terminal of the first oscillator 13, its output terminal connected to the control input terminal of the first oscillator 13, and its control input terminal connected to the output terminal of the channel selector 11.

In the second frequency conversion stage 5, the second frequency mixer 16 has its second input terminal connected to the output terminal of the second oscillator 17, and its output terminal connected via the low-pass filter 19 to the input terminal of the signal divider 6 located downstream. The second phase-locked loop 18 has its input terminal connected to the output terminal of the second oscillator 17, its output terminal connected to the control input terminal of the second oscillator 17, and its control output terminal connected to the output terminal of the channel selector 11. The analog signal demodulator 7 has its input terminal connected to the first output terminal of the signal divider 6, and its output terminal connected to the analog signal output terminal 9.

The digital signal demodulator 8 has its input terminal connected to the second output terminal of the signal divider 6, and its output terminal connected to the digital signal output terminal 10. In this setup, if the base-band signal of the channel-select received signal is an analog signal, the second oscillator 17 operating on the control voltage from the second phase-locked loop 18 generates a second local oscillation signal having a first frequency. If the base-band signal of the channel-select received signal is a digital signal, the second oscillator 17 generates a second local oscillation signal having a second frequency which is higher than the first frequency.

The double conversion television tuner 1 having the above constitution and practiced as the first embodiment of the invention works as follows: the channel selector (channel-select buttons) 11 is initially operated to select a desired telecast (the process is called selection of the received signal). At the same time, the format of the base-band signal in the received signal is selected to be either analog or digital format (the process is called selection of the signal format). Upon selection of the received signal, the output voltage of the first phase-locked loop 14 in the first frequency conversion stage 4 varies. This in turn controls the frequency of the first local oscillation signal of the first oscillator 13 whose frequency is controlled by the output voltage of the PLL 14. Upon selection of the signal format, the output voltage of the second phase-locked loop 18 in the second frequency conversion stage 5 is adjusted. This controls the frequency of the second local oscillation signal of the second oscillator 17 whose frequency is controlled by the output voltage of the PLL 18. The second local oscillation signal of the second oscillator 17 is switched to the first frequency if the base-band signal of the channel-select received signal is an analog signal. If the base-band signal of the channel-select signal is a digital signal, the second local oscillation signal of the second oscillator 17 is switched to the second frequency which is higher than the first frequency.

Upon receipt by an antenna (not shown), the received signal is forwarded to the antenna input terminal 2. The broad-band pass filter 3 is given the received signal and removes unnecessary components therefrom. From the broad-band pass filter 3, the received signal is sent to the first frequency conversion stage 4. The first frequency conversion stage 4 mixes the received signal and the first local oscillation signal in terms of frequency, and supplies the frequency-mixed output to the band-pass filter 15. From the received signal, the band-pass filter 15 extracts only the channel-select received signal selected by the channel selector 11, i.e., a first intermediate frequency signal obtained by converting the received signal into a first intermediate frequency $f_{IF1}$. The first intermediate frequency signal is fed to the second frequency conversion stage 5 located downstream.

The second frequency conversion stage 5 mixes in terms of frequency the first intermediate frequency signal on the one hand, and the first frequency (if the base-band signal of the channel-select received signal is an analog signal) or the second frequency (if the base-band signal of the channel-select received signal is a digital signal) generated by the second oscillator 17 on the other hand. The frequency-mixed output is fed to the low-pass filter 19. The low-pass filter 19 extracts as a second intermediate frequency signal the channel-select received signal with its frequency converted to a second intermediate frequency $f_{IF2A}$ or $f_{IF2D}$. The signal thus extracted is forwarded to the signal divider 6 located downstream.

The signal divider 6 divides the second intermediate frequency signal into two parts, one part destined to the analog signal demodulator 7 and the other part to the digital signal demodulator 8. If the base-band signal of the second intermediate frequency signal thus supplied is an analog signal, the analog signal demodulator 7 demodulates the second intermediate frequency signal to analog format and sends the demodulated output to the analog signal output terminal 9. If the base-band signal of the second intermediate frequency signal thus supplied is a digital signal, the digital signal demodulator 8 demodulates the second intermediate frequency signal to digital format and sends the demodulated output to the digital signal output terminal 10.

In the double conversion television tuner 1 embodying the invention as described, if the base-band signal of the channel-select received signal is an analog signal, the oscillation frequency of the second oscillator 17 in the second frequency conversion stage 5 is switched to the first frequency. In this case, the second intermediate frequency signal having the second intermediate frequency $f_{IF2A}$ is output. If the base-band signal of the channel-select received signal is a digital signal, the oscillation frequency of the second oscillator 17 in the second frequency conversion stage 5 is switched to the second frequency which is higher than the first frequency. Here, the second intermediate frequency signal having the second intermediate frequency $f_{IF2D}$ lower than the second intermediate frequency $f_{IF2A}$ is output. Thus during digital signal demodulation, there is no need to further lower the frequency of the second intermediate frequency signal. This means that the third frequency conversion stage conventionally utilized in the double conversion television tuner is no longer necessary. Dispensing in this manner with the third frequency conversion stage, the first embodiment reduces beat disturbances between local oscillation signals to improve the reception performance of the tuner while diminishing the number of circuit components to cut the production costs of the tuner.

Figure 2:
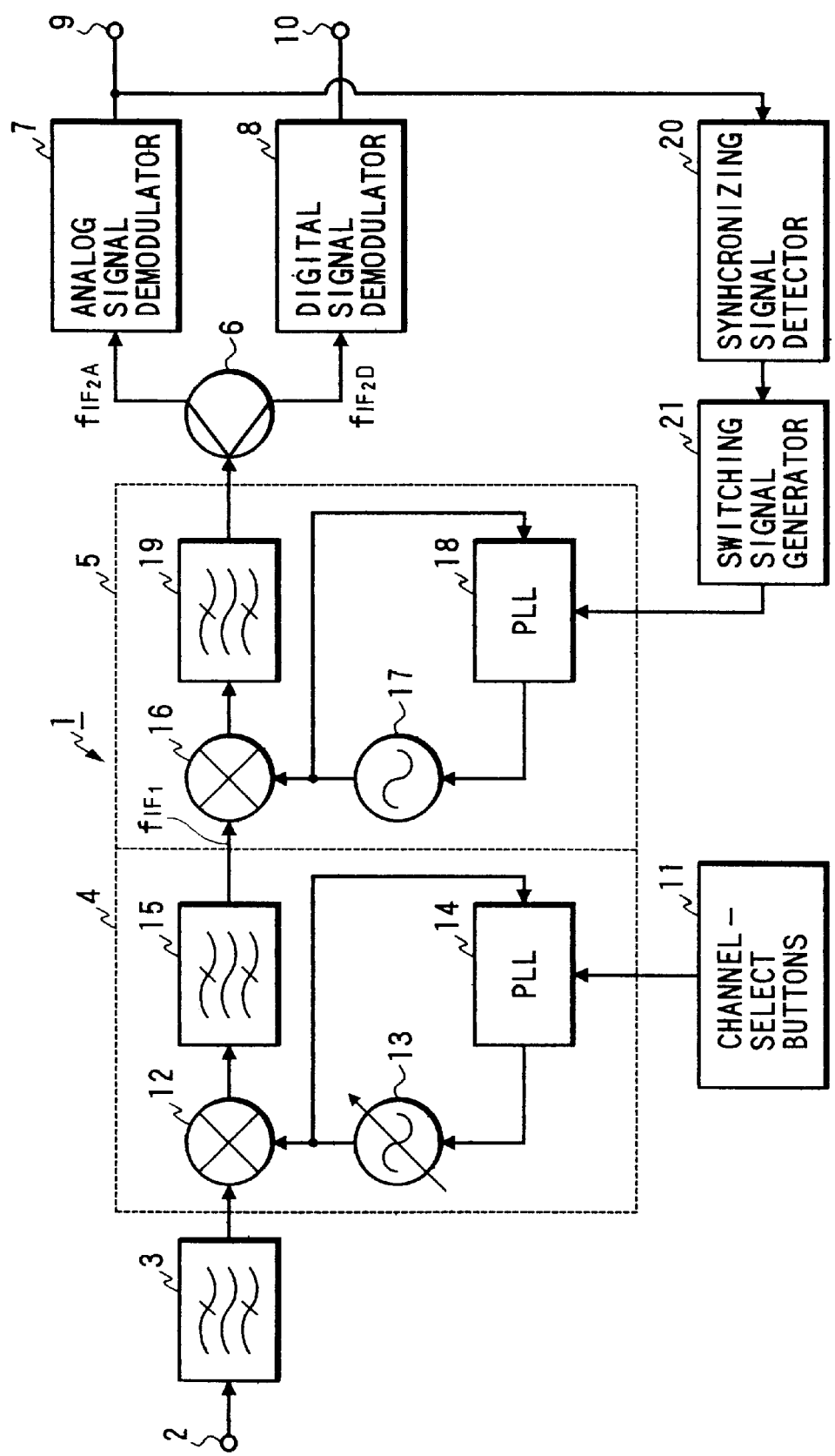
FIG. 2 is a block diagram of another double conversion television tuner practiced as a second embodiment of the invention.

FIG. 2 is a block diagram of another double conversion television tuner practiced as the second embodiment of the invention. The difference between the first and the second embodiments is that whereas the first embodiment selects the signal format using the channel selector 11 as its oscillation frequency selecting means for selectively switching the oscillation frequency of the second oscillator 17 to the first or the second frequency in the second frequency conversion stage 5 the second embodiment utilizes a synchronizing signal detector 20 and a switching signal generator 21 for selecting the signal format. There are no other structural differences between the first and the second embodiments.

In the second embodiment, the synchronizing signal detector 20 has its input terminal connected to the output terminal of the analog demodulator 7, and its output terminal connected to the input terminal of the switching signal generator 21. The switching signal generator 21 has its output terminal connected to the control input terminal of the second phase-locked loop 18 in the second frequency conversion stage 5. In the first and the second embodiments, like reference numerals designate like or corresponding parts and descriptions of these parts are omitted where they are repetitive.

The second embodiment works in substantially the same manner as the first embodiment, and offers approximately the same effects as the first embodiment. Thus the workings of and the effects by the second embodiment will not be described further in detail, except for a few points of interest below:

If the base-band signal of the channel-select received signal is an analog signal, the synchronizing signal detector 20 in the second embodiment detects a synchronizing signal contained in the analog signal demodulated by the analog signal demodulator 7. Upon detection of the synchronizing signal, the switching signal generator 21 generates a switching signal by which to set the local oscillation signal of the second oscillator 17 to the first frequency. The switching signal is supplied to the control input terminal of the second phase-locked loop 18 so that the second oscillator 17 will generate a local oscillation signal having the first frequency. If the base-band signal of the channel-select received signal is a digital signal, the digital signal is not demodulated by the analog signal demodulator 7. Thus the synchronizing signal detector 20 does not detect any synchronizing signal. With no synchronizing signal detected, the switching signal generator 21 outputs a switching signal by which to set the local oscillation signal of the second oscillator 17 to the second frequency. This switching signal is fed to the control input terminal of the second phase-locked loop 18 so that the second oscillator 17 will generate a local oscillation signal having the second frequency which is higher than the first frequency.

In the second embodiment, as described, the local oscillation signal of the second oscillator 17 is switched automatically to the first or the second frequency depending on the presence or absence of a synchronizing signal at the output terminal of the analog signal demodulator 7. Thus in a period of transition from analog to digital base-band signal format in telecast signals, if users may remain unaware of the base-band signal format of any channel-select received signal, the tuner takes care of all frequency-switching operations, i.e., the local oscillation signal of the second oscillator 17 is automatically switched to the appropriate frequency corresponding to the base-band signal format of a given channel-select received signal.

Figure 3:
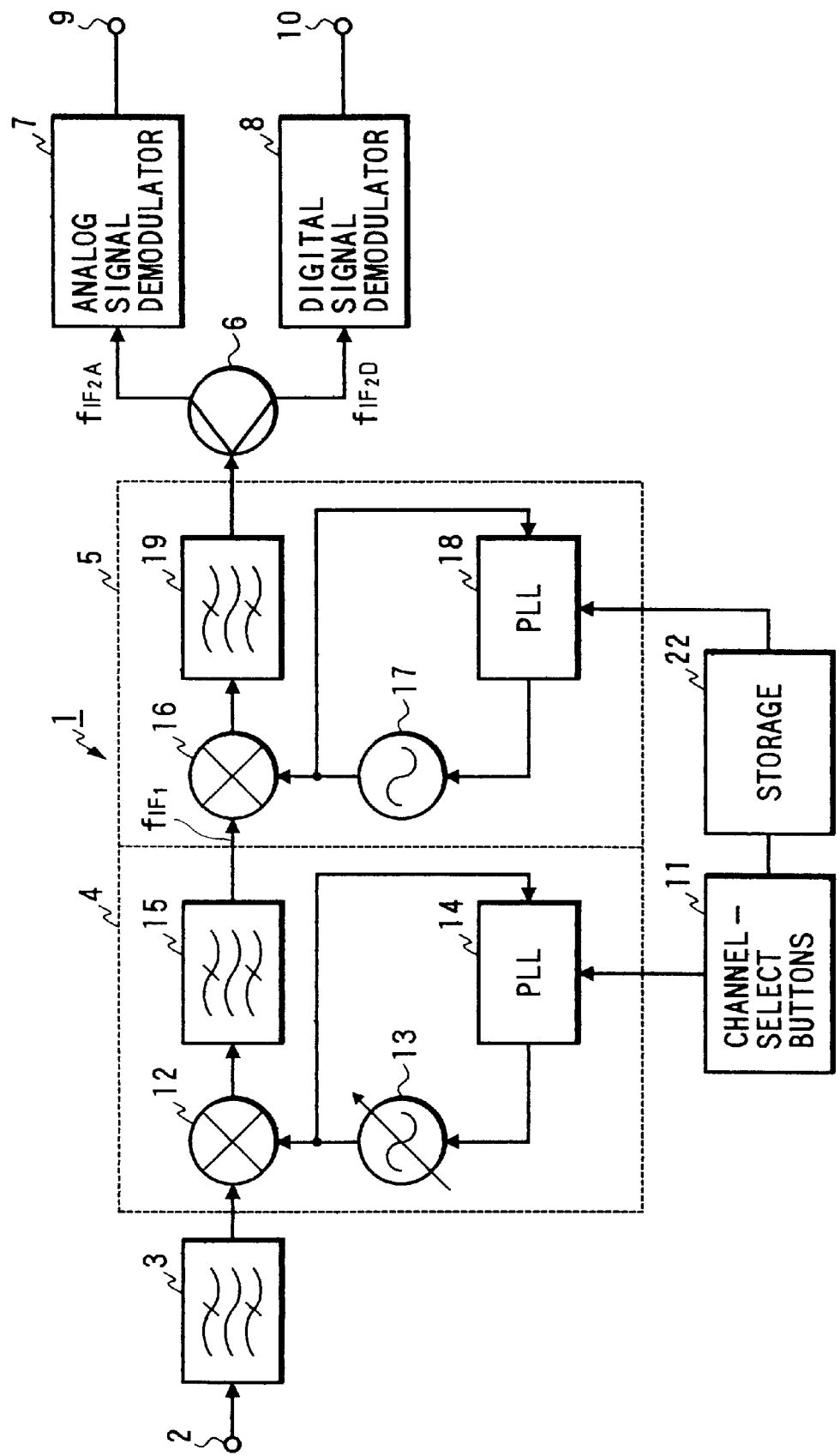
FIG. 3 is a block diagram of another double conversion television tuner practiced as a third embodiment of the invention.
Figure 4:
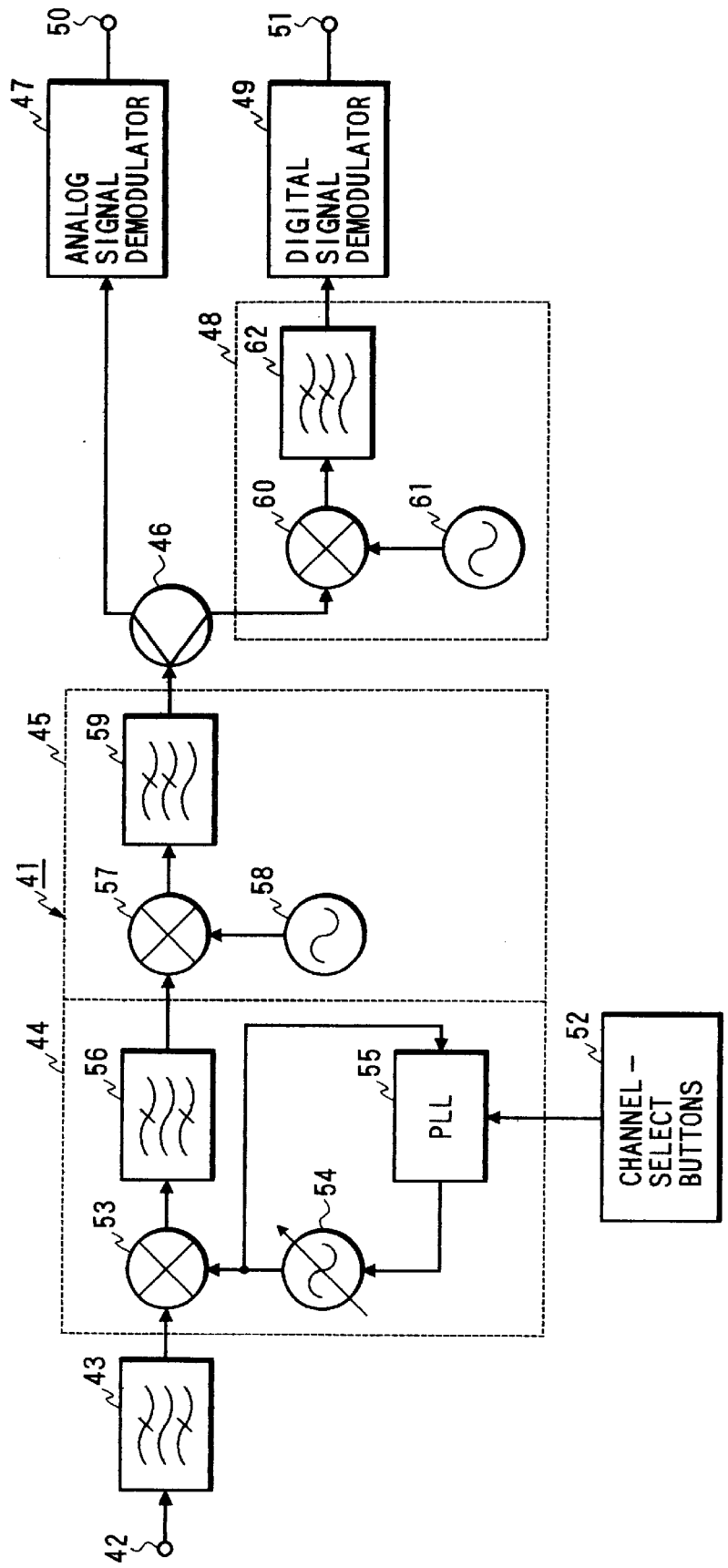
FIG. 4 is a block diagram of a conventional double conversion television tuner.

FIG. 3 is a block diagram of another double conversion television tuner practiced as the third embodiment of the invention. The difference between the first and the third embodiments is that whereas the first embodiment selects the signal format using the channel selector 11 as its oscillation frequency selecting means for selectively switching the oscillation frequency of the second oscillator 17 to the first or the second frequency in the second frequency conversion stage 5, the third embodiment selects the signal format by utilizing a storage 22 for storing the base-band signal format corresponding to each of the channel-select received signals to be selected. There are no other structural differences between the first and the third embodiments.

In the third embodiment, the storage 22 has its input terminal connected to the channel selector 11, and its output terminal connected to the control input terminal of the second phase-locked loop 18 in the second frequency conversion stage 5. In the first and the third embodiments, like reference numerals also designate like or corresponding parts and descriptions of these parts are omitted where they are repetitive.

The third embodiment works in substantially the same manner as the first embodiment, and offers approximately the same effects as the first embodiment. Thus the workings of and the effects by the third embodiment will not be described further in detail, except for a few points of interest below:

When a channel-select received signal is selected by operation of the channel selector 11 in the third embodiment, the base-band signal format corresponding to the received signal is read from the storage 22 and supplied to the control input terminal of the second phase-locked loop 18 in the second frequency conversion stage 5. If the read-out signal format is analog format, the second phase-locked loop 18 causes the second oscillator 17 to switch the second local oscillation signal to the first frequency. If the read-out signal format is digital format, the second phase-locked loop 18 causes the second oscillator 17 to switch the second local oscillation signal to the second frequency which is higher than the first frequency.

In the third embodiment, as described, the storage 22 retains the base-band signal formats corresponding to available channel-select received signals to choose from. Every time a channel-select received signal is selected, the base-band signal format corresponding to the channel-select received signal is read from the storage 22, and the local oscillation signal of the second oscillator 17 is automatically switched to the first or the second frequency. As with the preceding embodiment, users may also remain unaware of the base-band signal format of any channel-select received signal, and the tuner allows the local oscillation signal of the second oscillator 17 to be automatically switched to the appropriate frequency corresponding to the base-band signal format of a given channel-select received signal.

For any one of the first through the third embodiments described above, there should preferably be the smallest possible difference between the second intermediate frequency $f_{IF2A}$ corresponding to the analog base-band signal on the one hand, and the second intermediate frequency $f_{IF2D}$ corresponding to the digital base-band signal on the other hand. Upon switchover of the local oscillation signal of the second oscillator 17 between the first and the second frequency, the minimum difference between the second intermediate frequencies diminishes the rate of change in the oscillation frequencies. This eliminates the need for specialized parts or structures in implementing the frequency switchover of the second oscillator 17.

As described and according to the invention, if the base-band signal of the channel-select received signal is an analog signal, the local oscillation signal used by the second frequency conversion stage 5 is switched illustratively to the first frequency. In this case, the output terminal of the second frequency conversion stage 5 outputs the second intermediate frequency signal having the frequency $f_{IF2A}$. If the base-band signal is a digital signal, the local oscillation signal is switched to the second frequency which is higher than the first frequency. Here, the output terminal of the second frequency conversion stage 5 outputs the second intermediate frequency signal having the frequency $f_{IF2D}$ which is lower than the frequency $f_{IF2A}$. Unlike the conventional double conversion television tuner, the inventive setup above eliminates the need for further lowering the frequency $f_{IF2D}$ of the second intermediate frequency signal using a third frequency conversion stage during demodulation of a digital telecast. In this manner, the third frequency conversion stage becomes unnecessary.

With the third frequency conversion stage omitted, the invention requires fewer oscillators for generating local oscillation signals and thereby diminishes possible beat disturbances between such signals. In addition, the absence of the third frequency conversion stage also means fewer circuit components and contributes to lowering the production costs of the double conversion television tuner.

As many apparently different embodiments of this invention may be made without departing from the spirit and scope thereof, it is to be understood that the invention is not limited to the specific embodiments thereof except as defined in the appended claims.

What is claimed is:

1. A double conversion television tuner comprising:
   a first frequency conversion stage for converting in frequency a channel-select received signal to a first intermediate frequency signal to be output;
   a second frequency conversion stage for converting in frequency said first intermediate frequency signal to a second intermediate frequency signal to be output; and
   a demodulation stage for demodulating said second intermediate frequency signal;
   wherein said channel-select received signal has an analog or a digital base-band signal format; and
   wherein the local oscillation signal of said second frequency conversion stage is switched to a first frequency or to a second frequency in accordance with the format of the base-band signal, said second frequency being different than said first frequency.

2. A double conversion television tuner according to claim 1, wherein said first frequency conversion stage includes:
   a first oscillator for generating a first local oscillation signal;
   a first phase-locked loop connected to said first oscillator and to a channel selector and activated by the selecting operation of said channel selector to control the frequency of said first local oscillation signal;
   a first frequency mixer for mixing the received signal and said first local oscillation signal; and
   a first intermediate frequency filter for extracting said first intermediate frequency signal from the output of said first frequency mixer; wherein said second frequency conversion stage includes:
   a second oscillator for selectively generating the local oscillation signal of said second frequency conversion stage;
   a second phase-locked loop connected to said second oscillator and to an oscillation frequency selecting means and activated by the selecting operation of said oscillation frequency selecting means to have the local oscillation signal of said second frequency conversion stage switched to either said first frequency or said second frequency;
   a second frequency mixer for mixing said first intermediate frequency signal and the local oscillation signal of said second frequency conversion stage; and
   a second intermediate frequency filter for extracting said second intermediate frequency signal from the output of said second frequency mixer; and wherein said demodulation stage includes:
   a signal divider for dividing said second intermediate frequency signal into two parts;
   an analog demodulator connected to one of two output terminals of said signal divider; and
   a digital demodulator connected to the other output terminal of said signal divider.

3. The double conversion television tuner according to claim 2, wherein said oscillation frequency selecting means is said channel selector;
   wherein, if said channel selector selects a received signal of which the base-band signal is an analog signal, said oscillation frequency selecting means switches the local oscillation signal of said second frequency conversion stage to said first frequency; and
   wherein, if said channel selector selects a received signal of which the base-band signal is a digital signal, said oscillation frequency selecting means switches the local oscillation signal of said second frequency conversion stage to said second frequency.

4. The double conversion television tuner according to claim 2, wherein said oscillation frequency selecting means includes a synchronizing signal detecting means connected to the output of said first demodulator constituting an analog demodulator;
   wherein, if said synchronizing signal detecting means detects a synchronizing signal, said oscillation frequency selecting means switches the local oscillation signal of said second frequency conversion stage to said first frequency; and
   wherein, if said synchronizing signal detecting means does not detect any synchronizing signal, said oscillation frequency selecting means switches the local oscillation signal of said second frequency conversion stage to said second frequency.

5. The double conversion television tuner according to claim 2, wherein said oscillation frequency selecting means includes storing means for storing said base-band signal formats corresponding to each of the channel-select signals to be selected;
   wherein, when said channel selector selects a received signal, said oscillating frequency selecting means reads from said storing means the base-band signal format corresponding to the received signal thus selected;
   wherein, if the read-out signal format is analog, said oscillation frequency selecting means switches the local oscillation signal of said second frequency conversion stage to said first frequency; and
   wherein, if the read-out signal format is digital, said oscillation frequency selecting means switches the local oscillation signal of said second frequency conversion stage to said second frequency.

6. The double conversion television tuner according to claim 1, wherein the local oscillation signal of said second frequency conversion stage is switched to said first frequency if said channel-select received signal has said analog base-band signal format or to said second frequency if said channel-select received signal has said digital base-band signal format, said second frequency being higher than said first frequency.

* * * * *